United States Patent [19]

McFadden et al.

[11] Patent Number: 5,292,625

[45] Date of Patent: Mar. 8, 1994

[54] METHOD FOR SELECTIVELY EXPOSING AN UNEVEN SUBSTRATE SURFACE

[75] Inventors: Francis J. McFadden, Lake Elmo; Michael F. Weber, Shoreview, both of Minn.

[73] Assignee: Minnesota Mining and Manufacturing Company, St. Paul, Minn.

[21] Appl. No.: 863,402

[22] Filed: Apr. 3, 1992

[51] Int. Cl.$^5$ .............................................. G03C 5/00
[52] U.S. Cl. ...................... 430/325; 430/323; 430/327; 437/225; 437/228; 437/229; 355/78; 156/655
[58] Field of Search ............ 430/325, 323, 324; 355/78; 437/225, 228, 229; 456/655; 362/32, 33

[56] References Cited

U.S. PATENT DOCUMENTS

| | | | |
|---|---|---|---|
| 3,273,999 | 9/1966 | Clark | 96/1.1 |
| 4,218,302 | 8/1980 | Dalisa | 204/299 |
| 4,264,149 | 4/1981 | De Zwart et al. | 350/346 |
| 4,670,095 | 6/1987 | Negishi | 156/655 |
| 4,806,442 | 2/1989 | Shiraski | 430/4 |
| 4,943,126 | 7/1990 | Lang | 350/3.69 |

FOREIGN PATENT DOCUMENTS 827832 11/1969 Canada ........................... 352/4

Primary Examiner—John Kight, III
Assistant Examiner—Duc Truong
Attorney, Agent, or Firm—Gary L. Griswold; Walter N. Kirn; Eric D. Levinson

[57] ABSTRACT

A method and apparatus for selectively exposing an uneven substrate surface. The method can be used to remove a coating from the upper portions of the substrate surface by applying photoresist over the coating, placing a prism on the coated substrate, projecting light rays through the prism toward the substrate surface, removing either the exposed or unexposed photoresist, and removing the exposed coating.

28 Claims, 3 Drawing Sheets

METHOD FOR SELECTIVELY EXPOSING AN UNEVEN SUBSTRATE SURFACE

FIELD OF THE INVENTION

The present invention relates to a method and apparatus for exposing to light selected portions of an uneven substrate surface without the use of a mask. The method may be used to remove a coating from either the upper or lower portions of the uneven substrate surface.

BACKGROUND OF THE INVENTION

It is well known that patterns of light may be formed by directing light rays through a mask toward a flat surface. This masking method may also be used to selectively remove a photosensitive material from a flat surface: the photosensitive material is applied to the flat surface; the mask is placed on top of the photosensitive material; light is directed through the mask to the photosensitive material; and then either the exposed or unexposed photosensitive material is removed, depending upon whether a "positive" or "negative" type of photosensitive material is used.

A mask may also be used to expose to light selected portions of a surface having upper and lower portions. However, if one seeks to expose only the upper portions of the substrate surface, it becomes necessary first to create a mask which will achieve this effect and then to properly align the mask with respect to the substrate surface to be exposed. The disadvantage of this approach is that as the distances between the raised portions of the substrate surface become increasing in small (e.g. on the order of 100 μm), the problem of aligning the mask and substrate surface becomes increasingly large.

U.S. Pat. No. 4,670,095 to Negishi discloses a maskless method for selectively exposing the sides of a sawtoothed-ridged surface (such as a fresnel plate). The patent teaches that a photosensitive agent may be selectively removed from the sides of the sawtoothed ridges by projecting light rays toward the photosensitive-covered surface at an oblique angle so that the sides of the ridges which face the light are exposed, while the opposite sides of the ridges are not exposed. While this method may be useful for removing photosensitive material from the sides of sawtoothed-shaped ridges, the method is less effective at removing photosensitive material from the tops of rectangular-shaped ridges (i.e. ridges having substantially vertical walls and a horizontal top) because the oblique light would not be normal to the horizontal surface of the tops of the rectangular ridges, thus decreasing the efficiency of the exposure, as well as exposing the sides of the ridges which face the light source, which may be undesirable. Furthermore, this "shadow" method becomes increasingly less effective as the distance between the ridges increases and the height of the ridges decreases, malting it difficult to expose the tops of the ridges without also exposing the lower surface of the substrate between the ridges. It would be desirable to have an effective method for exposing the raised portions of a substrate surface without exposing the lower portions of the surface, even where the height of the raised portions is small compared with the distance between them.

SUMMARY OF THE INVENTION

The present invention includes a method for selectively removing a coating (such as an electrically conductive coating) from either the upper or lower portions of an uneven surface by: applying a layer of photosensitive material over the coated substrate; placing a prismatic element on the photosensitive-covered, substrate surface; projecting light rays through the prismatic element toward the substrate surface so that the portions of the photosensitive material proximate the prismatic element are exposed to the light rays, while the portions of the photosensitive material not proximate the prismatic element are left unexposed; removing those portions of the photosensitive material which are soluble in developer; and removing those portions of the coating which are no longer covered by the photosensitive material. The photosensitive material which remains may also be removed.

One embodiment of the present invention includes a method for selectively exposing portions of a substrate surface having upper and lower portions, including: (1) placing a prismatic element adjacent a substrate surface having upper and lower portions; and (2) projecting light rays from a light source through the prismatic element toward the substrate surface so that the portions of the substrate surface proximate the prismatic element are exposed to said light rays, while the portions of the substrate not proximate the prismatic element are left unexposed. The light source may be any conventional source emitting radiation to which the photosensitive material is sensitive. Alternatively, the light source may be a laser which can be used to melt, ablate, or otherwise physically or chemically alter the portions of the substrate surface which are exposed to the light rays.

Another embodiment of the present invention includes an apparatus for selectively exposing portions of a substrate surface in a step and repeat mode. Yet another embodiment of the present invention includes an apparatus for selectively exposing portions of a flexible substrate surface in a continuous mode.

The present invention finds particular utility in the preparation of liquid crystal substrates containing integral spacing elements, such as a series of parallel ridges, where it is desired to have a previously applied electrically conductive coating selectively removed from the top surface of the spacing elements.

BRIEF DESCRIPTION OF THE DRAWINGS

The present invention will be further described with reference to the accompanying drawings wherein like reference numerals refer to like parts in the several views, and wherein.

DETAILED DESCRIPTION OF THE DRAWINGS

Figure 1:
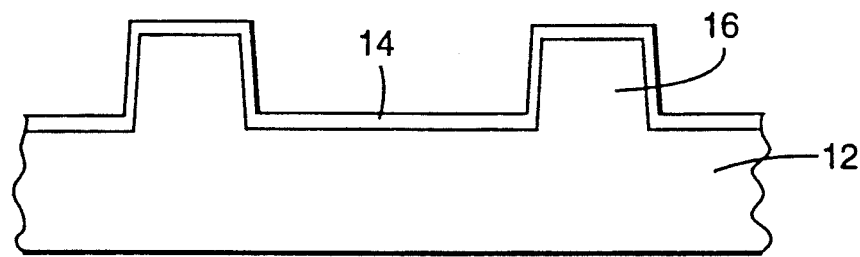
FIG. 1 is a cross-sectional view of a coated substrate surface before application of the method of the present invention.

A substrate 12 having a series of raised, parallel, rectangular ridges 16 covered with a coating 14 is shown in FIG. 1. Typically substrate 12 can be a half-cell for a liquid crystal display device, and coating 14 can be an electrically conductive coating, such as indium tin oxide (ITO), wherein coating 14 is applied to the surface of the substrate to form electrodes for switching the device. The half-cell is then mated with another similar half-cell to form a display device having an x-y array of electrodes. In order to prevent shorting of the electrodes it may be desirable to remove coating 14 from the tops of ridges 16. The method of the present invention is particularly suited to this purpose.

Figure 4:
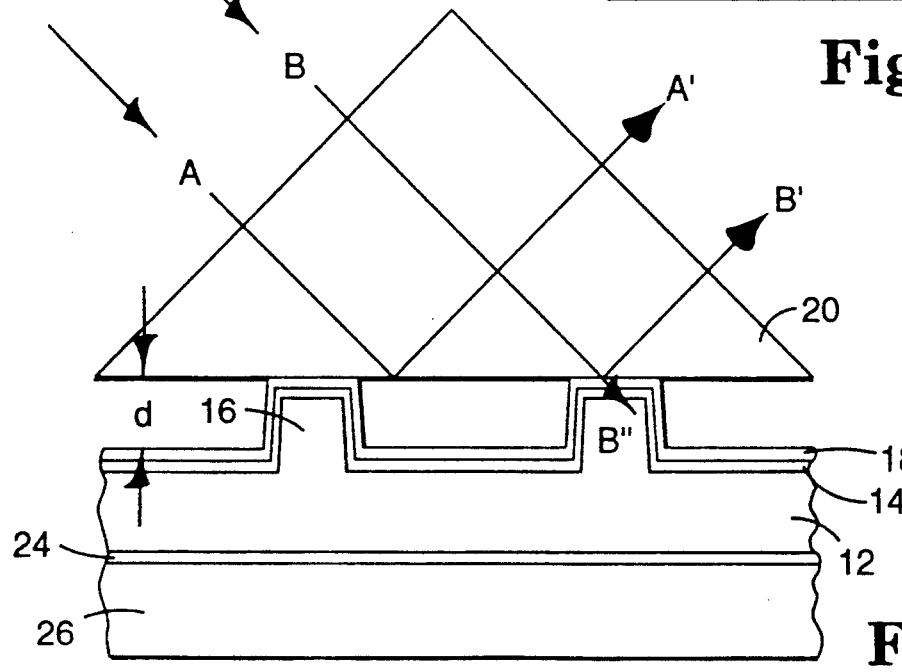
FIG. 4 is a front view of an apparatus for selectively exposing areas of a substrate surface in accordance with the present invention.

The first step of the present invention involves applying a layer of photosensitive material 18 over coating 14, as shown in FIG. 4. Prismatic element 20 is then placed in contact with the coated ridges 16 of substrate 12. Prismatic element 20 preferably is a right-angle (or 45-45-90) prism in which the light enters generally normal to a face opposite to a 45° angle, is totally reflected at the hypotenuse face, and leaves by the third face, thus having been totally reflected through 90°.

In the practice of the present invention, a light source 22 directs collimated light perpendicular to the surface of prismatic element 20, as shown in FIG. 4. In accordance with known laws of optics, a ray of light traveling in a generally downward direction in prismatic element 20 will be totally reflected at the lower surface thereof provided that the sine of the angle between ray A and a normal to the lower surface of prismatic element 20 is greater than the ratio of the refractive index, $n_1$, of the material below prismatic element 20 to the refractive index, $n_2$, of prismatic element 20. Thus, for a prismatic element 20 made from ordinary glass ($n_2 = 1.5$), a ray having an angle of incidence greater than 42 degrees from a normal to the surface will be reflected by the surface when the material below prismatic element 20 is air, ($n_1 = 1.0$). Referring to FIG. 4, light rays, such as A, will be totally reflected wherever prismatic element 20 is not in contact with photosensitive material 18. Thus ray A will be reflected at the prism/substrate interface, and the underlying photosensitive material 18 will not be exposed.

Light rays, such as ray B, however, will not be totally reflected where prismatic element 20 is in contact with photosensitive material 18. Such rays will be only partially reflected at the prism/photosensitive material interface. Thus, ray B will be partially reflected as B' while the remainder of B is transmitted to the photosensitive material 20 as B''. The intensity of transmitted ray B'' may be increased by selecting a photosensitive material 18 having an index of refraction which is close to the index of refraction of prismatic element 20. The intensity of transmitted ray B'' should be high enough to cause the desired change in photosensitive material 18.

The intensity of transmitted ray B'' will decrease (but will not become zero) if photosensitive layer 18 is separated from prismatic element 20 by a distance which is small compared with the wavelength of light being used. This is so because light is not totally internally reflected within a prism when there is an object within a distance from the prism that is smaller than the wavelength of light being used (where the object has an index of refraction greater than air, i.e. greater than 1.0). Thus, where the separation d between the prismatic element 20 and photosensitive material 18 is greater than about 0.4 μm (for light of wavelength 400 nm), the photosensitive material 18 will not be exposed. For separations d of less than 0.4 μm, some of the photosensitive material will be exposed, depending upon the magnitude of separation d, the length of the exposure time, and the intensity of light source 22.

Figure 5:
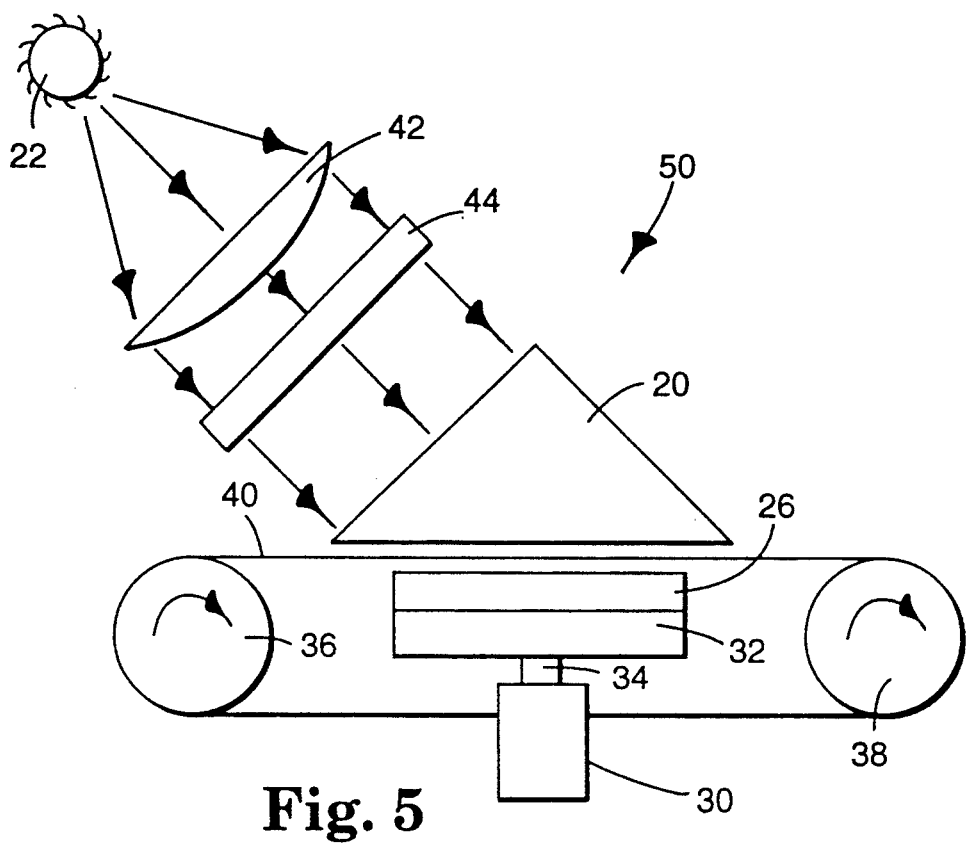
FIG. 5 is a side view of an apparatus in accordance with the present invention for carrying out the invention in a step and repeat mode.

Ideally, prismatic element 20 should be in contact with photosensitive layer 18 at all portions that are desired to be exposed. Preferably, the separation d between the two should not exceed 0.2 μm. The term "proximate" will be used hereinafter to denote a distance of 0.2 μm or less. Substrate 12 may be held against prismatic element 20 by applying force to pressure pad 26, as shown in FIGS. 4 and 5. A liquid layer having useful optical properties may be applied to the bottom of prismatic element 20 in order to improve optical coupling between the prismatic element and the portion of the surface of substrate 12 to be exposed to light.

If coating 14 and substrate 12 are both transparent, light ray B'' may continue through substrate 12 until it reaches the lower side of substrate 12. If the lower side of substrate 12 is adjacent a layer of air, ray B'' could be reflected back toward photosensitive material 18, where it could expose areas of the photosensitive material which were not intended to be exposed. The amount of light reflected depends on the fresnel coefficient of reflection for that interface. For this reason, a light absorbing layer 24 is preferably placed below substrate 12.

Thus, photosensitive material 18 on the tops of ridges 16 is exposed to light in the manner described above. Photosensitive material 18 is preferably a material commonly referred to as photoresist. As is well known in the art, photoresist is divided into two types: positive and negative. When positive photoresist is used, the portion of the photoresist on the tops of ridges 16 which was exposed to the light rays can be developed off, such as by dissolving with a solvent, revealing coating 14 underneath. Those portions between ridges 16 which are not exposed to light rays remain. The remaining photoresist is then rinsed with deionized water, dried, and oven baked to roughen it. Light rays having a wavelength in the range of 350-450 nm are preferred for most types of photoresist.

Figure 2:
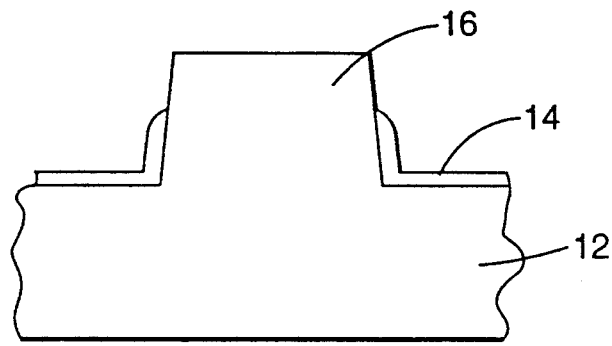
FIG. 2 is a cross-sectional view of a coated substrate surface after application of the method of the present invention for removing a coating from the upper portions of the substrate.

The coating 14 on the tops and upper sides of ridges 16 revealed by the selective removal of photoresist layer 18 may now be etched off because those portions of coating 14 are no longer protected by the photoresist. The remaining photoresist may then be removed by methods familiar to those skilled in the art. Thus, the uniform coating 14 shown in FIG. 1 is removed from the tops of ridges 16, as shown in FIG. 2.

Figure 3:
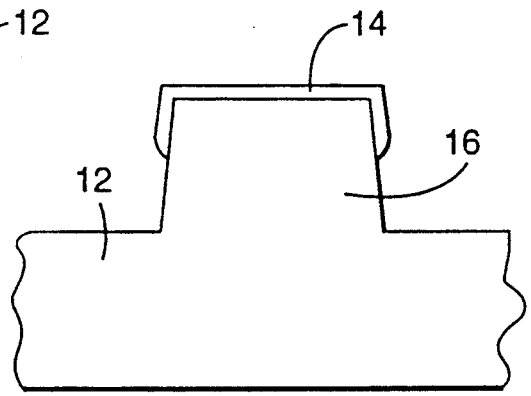
FIG. 3 is a cross-sectional view of a coated substrate surface after application of the method of the present invention for removing a coating from the lower portions of the substrate.

Those skilled in the art will appreciate that the portions of coating 14 located on the lower portions of the surface of substrate 12 and on the lower sides of ridges 16 may be removed in a manner analogous to that described above by using negative photoresist or positive photoresist in the negative mode. Thus, those portions of coating 14 lying beneath the portions of the photoresist which are not exposed because they are not proximate prismatic element 20 may be removed. The result is that the uniform coating 14 shown in FIGURE I is removed from the lower portions of the surface of substrate 12 (i.e. between ridges 16), as shown in FIG. 3.

In FIG. 4, ridges 16 are oriented parallel to the apex of prismatic element 20. With this geometry, the photosensitive material 18 on the upper right side of the ridges 16 will be exposed to more light than the photosensitive material 18 on the left side. If, however, the right face of prismatic element 20 were also illuminated with collimated light from a second light source (not shown), then the photosensitive material 18 on the upper portion of both sides of ridges 16 would be exposed.

Alteratively, the right face of prismatic element 20 may be aluminized to accomplish a similar result. If this were done, light rays A' and B' would be reflected back along their respective paths. An analysis of the light ray paths through photosensitive material 18 on the right side of ridges 16 shows that, for a typical case, light incident on the photoresist-air interface would be totally internally reflected. Some of the incident light rays would, however, be attenuated by optical absorption in coating 14.

Another way to orient substrate 12 is to have ridges 16 be perpendicular to the apex of prismatic element 20. With this arrangement, light which is transmitted into photosensitive material 18 near the side walls of ridges 16 can expose the photosensitive material 18 on the side walls without being attenuated by passing through coating 14. This is advantageous where it is desired to remove coating 14 from the sides of ridges 16.

Figure 6:
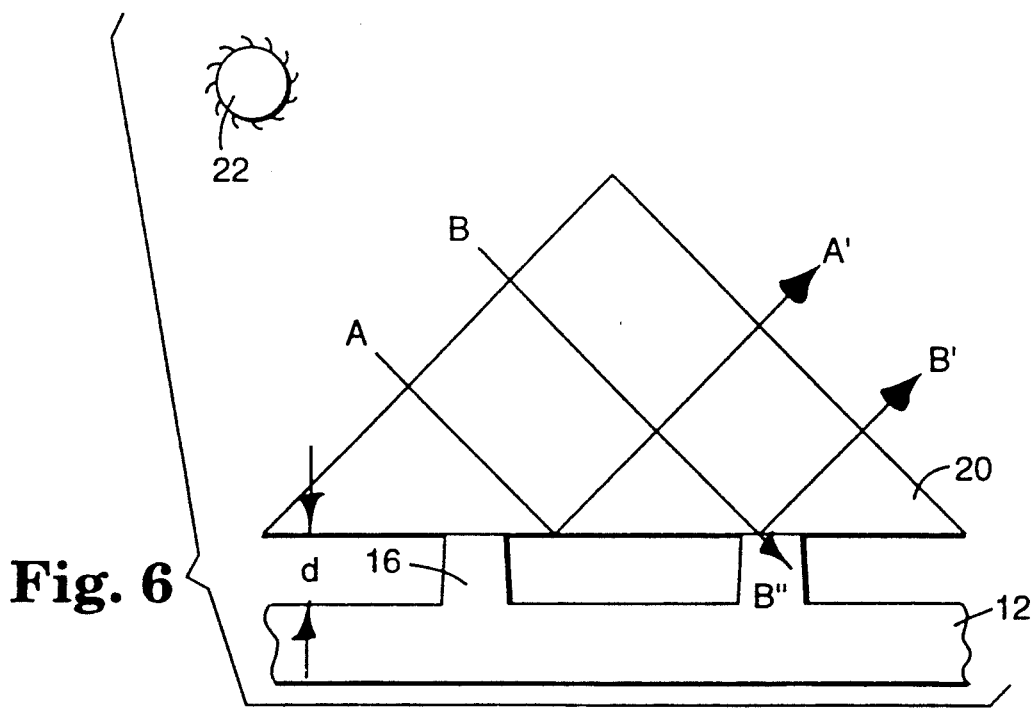
FIG. 6 is a side view of an apparatus for selectively exposing to light portions of a substrate surface.

The method of the present invention may also be used to etch the tops of ridges 16 on substrate 12, as shown in FIG. 6. Light rays passing through prismatic element 20 will illuminate those portions of substrate 12 which are proximate to the prismatic element. In one embodiment, light source 22 can be a laser which directs high intensity, collimated light rays through prismatic element 20 toward substrate 12 to the tops of ridges 16 (so long as the tops of the ridges are proximate the prismatic element). The laser can be used to melt or ablate the tops of ridges 16. This apparatus can also be used to melt, ablate, or otherwise physically or chemically alter a coating (not shown) on the tops of ridges 16 of substrate 12.

The method of the present invention may be practiced on large area samples in a step and repeat mode with the use of apparatus 50, shown in FIG. 5. Prismatic element 20 is suspended over adjustable table 30. Pressure pad 26 is placed on top of table 30 and is supported by rigid backing plate 32. Pressure pad 26 is made of a resilient material to ensure good physical contact between prismatic element 20 and the tops of ridges 16 on substrate 12. Table 30 is made adjustable through the use of pneumatic cylinder 34. Rollers 36 and 38 power transport belt 40, which is interposed between pressure pad 26 and prismatic element 20.

Light rays are directed incident to the left side of prismatic element 20 by condensing lens 42, which is preferably a large diameter planoconvex condenser lens made of Pyrex TM or similar material which transmits light in the wavelength rage of 350-450 nm. Light source 22 is a high intensity, small area light source such as a high pressure mercury vapor lamp. An electrically operated shutter 44 may be used to control exposure duration.

The sample to be treated (not shown) is placed on transport belt 40, which moves the sample into place between prismatic element 20 and pressure pad 26. Pneumatic cylinder 34 then forces pressure pad 26 up against belt 40, thus forcing the sample against prismatic element 20. (The force used should not be so great that the lower portions of the sample surface are forced against prismatic element 20.) The sample is illuminated by the prism method discussed earlier, and then cylinder 34 retracts, lowering the sample away from prismatic element 20. The sample then moves along on belt 40 to its next destination.

Prismatic element 20 may be a solid glass prism made of a material such as BK7 (Schottglass). Alternatively, a hollow prism of fused silica plates cemented together on the edges and filled with an index matching fluid can be used. A suitable index matching fluid is made by R. P. Cargille Laboratories, Inc. (Specially Optical Fluid No. 50350 or No. 06350). The principal advantage of a liquid-filled prism over a solid prism is cost. Alternatively, prismatic element 20 may be a series of tiny, parallel, adjacent prisms, such as Scotch TM Optical Lighting Film, available from 3M Company.

Figure 7:
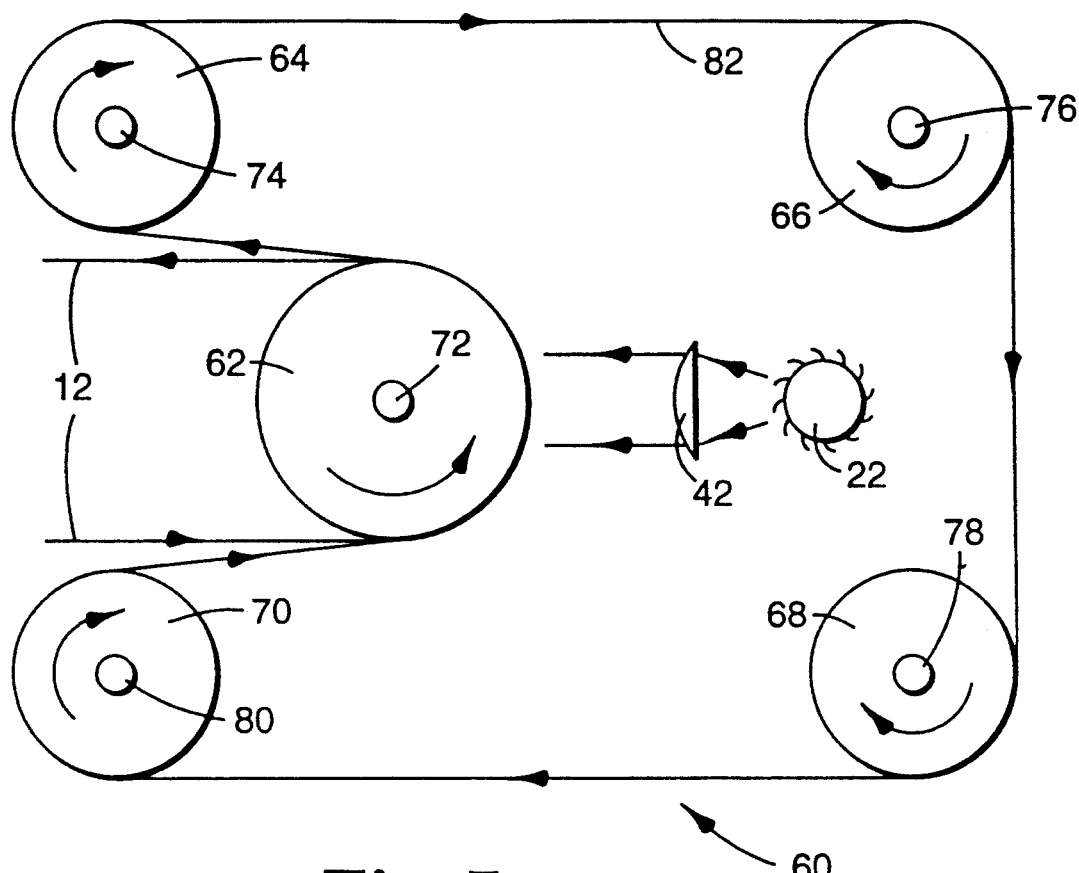
FIG. 7 is a side view of an apparatus in accordance with the present invention for carrying out the invention in a continuous mode.

The method of the present invention may be practiced on large area samples in a continuous mode with the use of apparatus 60, shown in FIG. 7. Belt 82 is wound about rolls 62, 64, 66, 68, and 70, which are mounted for rotation about axes 72, 74, 76, 78, and 80, respectively. Belt 82 is a transparent film having a series of tiny, parallel adjacent prismatic elements, such as Scotch TM Optical Lighting Film. The surface of belt 82 having the prismatic elements faces toward light source 22 as the belt moves around roll 62.

Substrate 12 is flexible and is wound about roll 62 and other rolls (not shown). The surface of substrate 12 to be exposed to light faces away from roll 62. Light source 22 and condensing lens 42 are located within the continuous loop formed by belt 82.

As shown in FIG. 7, one end of substrate 12 is drawn away from roll 62 by motor (not shown). This forces a counter-clockwise rotation of roll 62 on its axis 72, which in turn draws additional portions of substrate 12 around and past the roll.

Figure 8:
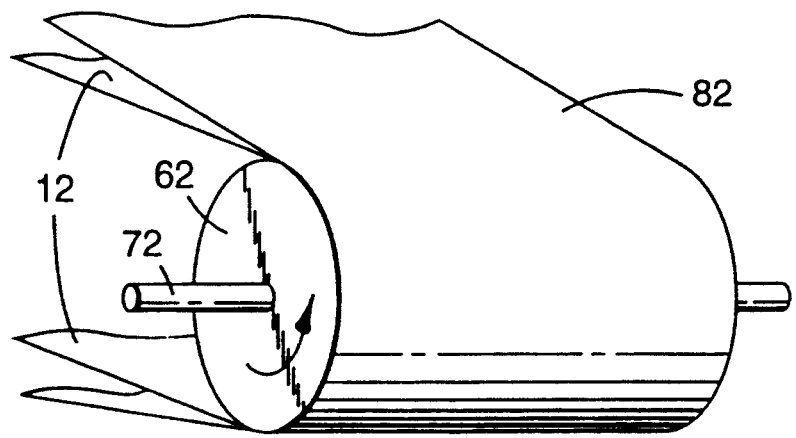
FIG. 8 is a perspective view of a portion of the apparatus shown in FIGURE 7.

As shown in FIG. 8, belt 82 does not directly contact roll 62 but rather contacts the surface of substrate 12 to be exposed. The orientation of roll 62 with respect to rolls 64 and 70 forces belt 82 to press tightly against substrate 16 on the side of roll 62 which faces light source 22. This pressure prevents belt 82 from moving with respect to substrate 12 at the point of contact. The counter-clockwise rotation of roll 62 causes a clockwise rotation of rolls 64, 66, 68, and 70, which creates a generally clockwise path of travel for belt 82, as shown in FIG. 7.

Light rays from light source 22 are collimated by condensing lens 42 toward the tiny prisms on belt 18. Light rays from light source 22 expose the portions of the surface of substrate 12 which are proximate belt 18. The rate of rotation of the rolls, the tension of belt 82, and the intensity of light source 22 may be adjusted to create the desired exposure of substrate 12.

Although the present invention has been described with reference to preferred embodiments, workers skilled in the art will recognize that changes may be made in form and detail without departing from the spirit and scope of the invention.

What is claimed is:

1. A method for selectively removing a coating from portions of a substrate surface having upper and lower portions, including the steps of
   a. applying a layer of photosensitive material over a substrate surface covered with a coating, wherein said substrate surface has upper and lower portions;
   b. placing a prismatic element on top of the photosensitive-covered, substrate surface;
   c. projecting light rays through said prismatic element toward said substrate surface so that the portions of said photosensitive material proximate said prismatic element are exposed to said light rays, while the portions of said photosensitive material not proximate said prismatic element are left unexposed;
   d. removing those portions of said photosensitive material which are soluble in developer; and
   e. removing those portions of said coating which are no longer covered by said photosensitive material.

2. The method according to claim 1, wherein said portions of said photosensitive material removed in step d are proximate to said prismatic element.

3. The method according to claim 1, wherein said portions of said photosensitive material removed in step d are not proximate said prismatic element.

4. The method according to claim 1, wherein said prismatic element is a prism.

5. The method according to claim 4, wherein said prism is a right-angle prism.

6. The method according to claim 1, wherein said prismatic element includes a plurality of parallel, adjacent prisms.

7. The method according to claim 1, wherein the side of said prismatic element opposite both said light source and said substrate surface is aluminized.

8. The method according to claim 1, wherein said substrate surface has a plurality of parallel ridges.

9. The method according to claim 8, wherein said coating is transparent and electrically conductive, and wherein said photosensitive material is photoresist.

10. The method according to claim I further including, prior to step c, placing a light absorbing layer on the side of said substrate opposite said substrate surface.

11. The method according to claim 1, further including, following step e, removing the remaining photosensitive material.

12. A method for selectively exposing portions of a substrate surface having upper and lower portions, including:
   placing a prismatic element on top of a substrate surface having upper and lower portions; and
   projecting light rays from a light source through said prismatic element toward said substrate surface so that the portions of said substrate surface proximate said prismatic element are exposed to said light rays, while the portions of said substrate surface not proximate said prismatic element are left unexposed.

13. The method according to claim 12, wherein said prismatic element is a prism.

14. The method according to claim 13, wherein said prism is a right-angle prism.

15. The method according to claim 12, wherein said prismatic element includes a plurality of parallel, adjacent prisms.

16. The method according to claim 12, wherein the side of said prismatic element opposite both said light source and said substrate surface is aluminized.

17. The method according to claim 12, wherein said substrate surface has a plurality of parallel ridges.

18. The method according to claim 12, wherein there is a light absorbing layer adjacent the side of the substrate opposite said substrate surface.

19. The method according to claim 12, wherein the light source is a laser.

20. The method according to claim 19, wherein the portions of said substrate surface exposed to said light rays are ablated by said light rays.

21. The method according to claim 19, wherein the portions of said substrate surface exposed to said light rays are melted by said light rays.

22. An apparatus for selectively exposing portions of a substrate surface having upper and lower portions, including, in combination:
   a. a prismatic element;
   b. means for accepting and holding a substrate in a given plane;
   c. means for moving said prismatic element and said substrate holding means toward one another so that said prismatic element can be brought in contact with said substrate; and
   d. a light source directed toward said prismatic element so that light rays from said light source travel through said prismatic element and illuminate those portions of said substrate surface which are proximate said prismatic element, but do not illuminate those portions of said substrate which are not proximate said prismatic element.

23. The apparatus according to claim 22, further including a means for moving said substrate with respect to said prismatic element so as to position different a real portions of said substrate surface adjacent said prismatic element.

24. The apparatus according to claim 22, wherein said means for accepting and holding a substrate includes a pressure pad.

25. The apparatus according to claim 22, wherein said light source is a laser.

26. The apparatus according to claim 22, further including a condensing lens for directing said light rays from said light source onto said prismatic element.

27. An apparatus for continuously exposing selected portions of a flexible substrate surface having Upper and lower portions, including, in combination:
   a. a transparent film having two sides, having a plurality of tiny, adjacent prismatic elements on one of said sides;
   b. a first rotatable roll and a plurality of other rotatable rolls, wherein said film is wound about said first roll and said plurality of other rolls, and wherein said first roll is configured to receive a flexible substrate between said first roll and said film;
   c. a light source directed toward said plurality of tiny, adjacent prismatic elements on said film so that light rays from said light source travel through said film and illuminate those portions of said substrate which are proximate said film, but do not illuminate those portions of said substrate which are not proximate said film; and
   d. means for rotating said first roll to move different a real portions of said substrate past said light source.

28. The apparatus according to claim 27, including a condensing lens for directing said light rays from said light source onto said film.

* * * * *

UNITED STATES PATENT AND TRADEMARK OFFICE
CERTIFICATE OF CORRECTION

PATENT NO. : 5,292,625
DATED : March 8, 1994
INVENTOR(S) : McFadden et al.

It is certified that error appears in the above-indentified patent and that said Letters Patent is hereby corrected as shown below:

Column 1, line 32, "increasing in" should read --increasingly--.
Column 1, line 57, "malting" should read --making--.
Column 5, line 2, "FIGURE I" should read --FIGURE 1--.

Column 8, line 34, "a real" should read --areal--.
Column 8, line 63, "a real" should read --areal--.

Signed and Sealed this

Twentieth Day of September, 1994

Attest:

BRUCE LEHMAN

Attesting Officer

Commissioner of Patents and Trademarks